(12) United States Patent
Wang et al.

(10) Patent No.: US 7,030,675 B1
(45) Date of Patent: Apr. 18, 2006

(54) APPARATUS AND METHOD FOR CONTROLLING A DELAY CHAIN

(75) Inventors: Bonnie I. Wang, Cupertino, CA (US); Joseph Huang, San Jose, CA (US); Chiakang Sung, Milpitas, CA (US); Yan Chong, San Jose, CA (US); Khai Nguyen, San Jose, CA (US); Henry Kim, San Jose, CA (US)

(73) Assignee: Altera Corporation, San Jose, CA (US)

( * ) Notice: Subject to any disclaimer, the term of this patent is extended or adjusted under 35 U.S.C. 154(b) by 81 days.

(21) Appl. No.: 10/932,642

(22) Filed: Aug. 31, 2004

(51) Int. Cl.
*H03H 11/26* (2006.01)

(52) U.S. Cl. ...................... 327/262; 327/263
(58) Field of Classification Search ............... 327/262, 327/263, 264, 265, 268, 269
See application file for complete search history.

(56) References Cited

U.S. PATENT DOCUMENTS

| | | | |
|---|---|---|---|
| 5,555,214 A | 9/1996 | Sung et al. | 365/221 |
| 5,633,830 A | 5/1997 | Sung et al. | 365/221 |
| 5,764,080 A | 6/1998 | Huang et al. | 326/41 |
| 5,802,540 A | 9/1998 | Sung et al. | 711/1 |
| 5,828,229 A | 10/1998 | Cliff et al. | 326/40 |
| 5,970,255 A | 10/1999 | Tran et al. | 395/893 |
| 6,011,744 A | 1/2000 | Sample et al. | 365/230.03 |
| 6,049,255 A | 4/2000 | Hagberg et al. | 331/17 |
| 6,100,713 A | 8/2000 | Kalb et al. | 326/30 |
| 6,128,692 A | 10/2000 | Sung et al. | 711/1 |
| 6,147,520 A | 11/2000 | Kothandaraman et al. | 327/77 |
| 6,236,231 B1 | 5/2001 | Nguyen et al. | 326/39 |
| 6,252,419 B1 | 6/2001 | Sung et al. | 326/38 |
| 6,279,073 B1 | 8/2001 | McCracken et al. | 711/105 |
| 6,472,904 B1 | 10/2002 | Andrews et al. | 326/38 |
| 6,477,115 B1 * | 11/2002 | Inoshita et al. | 368/120 |
| 6,504,790 B1 | 1/2003 | Wolford | 365/233 |
| 2005/0088219 A1 * | 4/2005 | Kim | 327/399 |

OTHER PUBLICATIONS

Michael B. Bendak et al., "CMOS VLSI Implementation of Gigabyte/Second Computer Network Links", IEEE, 1996, pp. 269-272.
"Virtex-II 1.5V Field-Programmable Gate Arrays", XILINX, DS031-2 (V1.5), Apr. 2, 2001, p. 1-36.
Andrea Boni et al., "LVDS I/O Interface for GB/S-Per-Pin Operation in 0.35-um CMOS" IEEE Journal of Solid-State Circuits, vol. 36, No. 4, Apr. 2001, pp. 706-711.
"Apex II Programmable Logic Device Family", Altera Corporation, May 2001, pp. 1-8, 38-59.
"Apex 20K Programmable Logic Device Family", Altera Corporation, May 2001, pp. 1-8, 37-47.

* cited by examiner

*Primary Examiner*—Linh My Nguyen

(57) ABSTRACT

A method and apparatus for updating the control signal received by a delay chain in a DDR application. A register is used to regulate the control signal to the delay chain. The register only updates the signal at the delay chain when a signal is not passing through the delay chain. Additionally, the present invention is directed to a delay circuit that uses a plurality of PMOS and NMOS transistors connected in parallel to each other and to an inverter that provides the desired delay. The delay provided is achieved by sequentially turning off/on a series of the NMOS/PMOS transistor pairs.

20 Claims, 16 Drawing Sheets

| c[4:0] | sel[3:0] | low[2:0] | stage 0 | stage 1 | stage 2 | stage 3 | | | | | | | |
|---|---|---|---|---|---|---|---|---|---|---|---|---|---|
| | | | all pairs | all pairs | all pairs | mn8-mp8 | mn7-mp7 | mn6-mp6 | mn5-mp5 | mn4-mp4 | mn3-mp3 | mn2-mp2 | mn1-mp1 |
| 00000 | 1000 | 111 | off | off | off | off | off | off | off | off | off | off | off |
| 00001 | 1000 | 111 | off | off | off | off | off | off | off | off | off | off | on |
| 00010 | 1000 | 111 | off | off | off | off | off | off | off | off | off | on | on |
| 00011 | 1000 | 111 | off | off | off | off | off | off | off | off | on | on | on |
| 00100 | 1000 | 111 | off | off | off | off | off | off | off | on | on | on | on |
| 00101 | 1000 | 111 | off | off | off | off | off | off | on | on | on | on | on |
| 00110 | 1000 | 111 | off | off | off | off | off | on | on | on | on | on | on |
| 00111 | 1000 | 111 | off | off | off | off | on | on | on | on | on | on | on |

| c[4:0] | sel[3:0] | low[2:0] | stage 0 | stage 1 | stage 2 | | | | | | | | stage 3 |
|---|---|---|---|---|---|---|---|---|---|---|---|---|---|
| | | | all pairs | all pairs | mn8-mp8 | mn7-mp7 | mn6-mp6 | mn5-mp5 | mn4-mp4 | mn3-mp3 | mn2-mp2 | mn1-mp1 | all pairs |
| 01000 | 0100 | 011 | off | off | off | off | off | off | off | off | off | off | on |
| 01001 | 0100 | 011 | off | off | off | off | off | off | off | off | off | on | on |
| 01010 | 0100 | 011 | off | off | off | off | off | off | off | off | on | on | on |
| 01011 | 0100 | 011 | off | off | off | off | off | off | off | on | on | on | on |
| 01100 | 0100 | 011 | off | off | off | off | off | off | on | on | on | on | on |
| 01101 | 0100 | 011 | off | off | off | off | off | on | on | on | on | on | on |
| 01110 | 0100 | 011 | off | off | off | off | on | on | on | on | on | on | on |
| 01111 | 0100 | 011 | off | off | on | on | on | on | on | on | on | on | on |

| c[4:0] | sel[3:0] | low[2:0] | stage 0 | | | | | | | | | stage 2 | stage 3 |
|---|---|---|---|---|---|---|---|---|---|---|---|---|---|
| | | | mn8-mp8 | mn7-mp7 | mn6-mp6 | mn5-mp5 | mn4-mp4 | mn3-mp3 | mn2-mp2 | mn1-mp1 | stage 1 all pairs | all pairs | all pairs |
| 10000 | 0010 | 001 | off | off | off | off | off | off | off | off | on | on | on |
| 10001 | 0010 | 001 | off | off | off | off | off | off | off | on | on | on | on |
| 10010 | 0010 | 001 | off | off | off | off | off | off | on | on | on | on | on |
| 10011 | 0010 | 001 | off | off | off | off | off | on | on | on | on | on | on |
| 10100 | 0010 | 001 | off | off | off | off | on | on | on | on | on | on | on |
| 10101 | 0010 | 001 | off | off | off | on | on | on | on | on | on | on | on |
| 10110 | 0010 | 001 | off | off | on | on | on | on | on | on | on | on | on |
| 10111 | 0010 | 001 | off | on | on | on | on | on | on | on | on | on | on |

| c[4:0] | sel[3:0] | low[2:0] | stage 0 | | | | | | | | stage 1 | stage 2 | stage 3 |
|---|---|---|---|---|---|---|---|---|---|---|---|---|---|
| | | | mn8-mp8 | mn7-mp7 | mn6-mp6 | mn5-mp5 | mn4-mp4 | mn3-mp3 | mn2-mp2 | mn1-mp1 | all pairs | all pairs | all pairs |
| 11000 | 0001 | 000 | on | on | on | on | on | on | on | on | on | on | on |
| 11001 | 0001 | 000 | on | on | on | on | on | on | on | on | on | on | on |
| 11010 | 0001 | 000 | on | on | on | on | on | on | on | on | on | on | on |
| 11011 | 0001 | 000 | on | on | on | on | on | on | on | on | on | on | on |
| 11100 | 0001 | 000 | on | on | on | on | on | on | on | on | on | on | on |
| 11101 | 0001 | 000 | on | on | on | on | on | on | on | on | on | on | on |
| 11110 | 0001 | 000 | on | on | on | on | on | on | on | on | on | on | on |
| 11111 | 0001 | 000 | on | on | on | on | on | on | on | on | on | on | on |

Figure 16

APPARATUS AND METHOD FOR CONTROLLING A DELAY CHAIN

BACKGROUND OF THE INVENTION

This invention relates generally to memory in integrated circuit devices. More particularly, this invention relates to a DDR memory implementation on an integrated circuit.

Due to rapid progress in design techniques and process technology, the speed of integrated circuit (IC) devices has increased considerably. Such a rapid change in the speed of IC devices has also led to increasingly demanding requirements on the memory devices that interface with these IC's. Besides having a high storage capacity, modern memory chips must be able to interface with other chips at increasingly faster speeds. Consequently, the use of Double Data Rate (DDR) memory devices for faster speed has become increasingly common. DDR memory devices differ from conventional memory devices by enabling data transfer on both the rising and falling edge of the clock, thereby doubling the peak throughput of the memory device.

A DDR memory device transmits both data (DQ) and its associated clock strobe (DQS). FIG. 1 shows the timing relationship of the DQ and the DQS signals for DDR applications. The DQ is transmitted from the DDR memory chip, edge-aligned with the DQS strobe. Both DQ and DQS are clocked off the system clock. The receiving IC device, e.g. an FPGA device, receives the edge-aligned DQ and DQS, and phase-shifts the DQS by 90° in order to align the DQS strobe to the center of the data eye. This 90° phase-shift is achieved by adding a delay chain in the DQS path with a delay equal to ¼ the system clock frequency (See FIG. 2).

FIG. 2 shows an exemplary circuit for controlling the DQS delay. Input pins 210 and 220 receive the DQ and DQS signals, respectively. Delay chain 230 provides a delayed DQS signal to DDR capture registers 250. Delay chain 230 is controlled by a control signal 260 provided by DLL 240. DLL 240 continuously tracks the system clock frequency and provides a control signal 260 that maintains the desired delay in the DQS signal.

During operation, the system clock can drift in time due to changing operating conditions such as a change in temperature or voltage. To compensate for this drift, the memory device uses a clock-drift tracking delay chain 230 with variable delay that will track the system clock in order to always provide a ¼ clock period delay.

The delay chain 230 is controlled by a 6-bit binary-encoded control signal 260 generated from DLL 240. Because the 6-bit control signal 260 is continuously changing to track the drifting system clock, the 6-bit control signal can change during the time DQS is propagating through the delay chain 230. This change can lead to an incorrect delay for the 90° DQS phase offset.

Additionally, the 6-bit control signal must propagate from DLL 240 to delay chain 230 and therefore the 6 control signals may arrive at delay chain 230 at different times, thereby causing the delay chain to be momentarily set to an incorrect delay. An arriving DQS strobe at this time would not be correctly aligned to the center of the data eye.

Further, the binary-encoded 6-bit control can lead to widely varying delays. For example, if the control signal from the DLL is going from 011111 to 100000, the delay chain could be momentarily set to or 000000 or somewhere in between.

FIG. 3 illustrates a case where control signal 260 is momentarily set to a lower value when DQS is passing through it. The delay cell will add some additional delay to DQS while control signal 260 is in this incorrect state. The resulting DQS signal will be phase shifted past the center of the data eye.

FIG. 4 illustrates a case where control signal 260 is momentarily set to a higher value when DQS is passing through it. The delay cell will be set to a smaller delay while control signal 260 is in this incorrect state. The resulting DQS signal will be phase shifted before the center of the data eye.

An additional problem with providing an accurate delay signal to delay chain 230 arises in the DLL 240. DLL 240 includes a plurality of delay chains that are used to accurately control the delay of the input signal to the DLL. FIG. 5 illustrates how a glitch can occur when there is more than one signal path, 410 and 420 in the delay chain. As can be seen in FIG. 5, a glitch may appear at the output 440 if the multiplexer 430 switches from signal path 420 to signal path 410 while the input signal is passing through the delay chain.

Additionally, as shown in FIG. 6, jitter may occur when two delay elements in a delay chain are switched in opposite directions at the same time, i.e. one is switched on while the other is switched off. For example, the inverter S0 has a delay of 200 ps and inverter S1 has a delay of 300 ps. If a 350 ps delay is needed instead of a 250 ps delay then S0 must be turned off and S1 must be turned on. When the delay time is switched from 250 ps to 350 ps, the delay signal passing through the delay chain should be between 250–350 ps. Instead, during switching one output edge gets a 500 ps delay, thereby producing jitter on the output.

In view of the above, there is a need in the art for a delay chain that does not cause jitter and glitch at the delay chain output signal. Additionally, there is a need in the art for providing a control signal for accurately controlling the delay of a delay chain in a DDR implementation.

SUMMARY OF THE INVENTION

The present invention provides for a method and apparatus for updating the control signal received by a delay chain in a DDR application. The device includes a delay chain having a DQS input, a DQS output and a control signal for updating the delay chain. A D-latch is used to regulate the control signal to the delay chain. The D-latch has an input D for receiving the control signal. If a DQS signal is passing through the delay chain, the D-latch will be disabled, thereby ignoring any changes at the input D and the control signal at the delay chain is not updated. If a DQS signal is not passing through the delay chain, the D-latch will pass through any changes at the input D and the control signal will be updated.

Additionally, the present invention is directed to a delay circuit. The delay circuit uses a plurality of PMOS and NMOS transistors connected in parallel to each other and to an inverter that provides the desired delay. The delay provided is achieved by sequentially turning off/on a series of the NMOS/PMOS transistor pairs, thereby reducing glitch and jitter at the output.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 16 is a truth table for the delay cell of FIG. 11.

DETAILED DESCRIPTION OF THE INVENTION

The present invention is directed to method and apparatus for accurately providing a DQS delay signal. The invention provides a scheme for updating the control signal provided at the delay chain only when no DQS signal is passing through the delay chain. Additionally, the invention provides for a scheme where the control signal is changed only when all control signals have arrived at the delay chain.

Additionally, the present invention provides for a delay chain that addresses the problems of jitter and glitch on output. This is achieved by passing the input signal through an inverter where the delay of the inverter is controlled by a plurality of transistors. Preferably, the transistors are current limiting transistors and provide substantially identical delay. To achieve the desired delay, a group of transistors is sequentially turned on or sequentially turned off.

Figure 1:
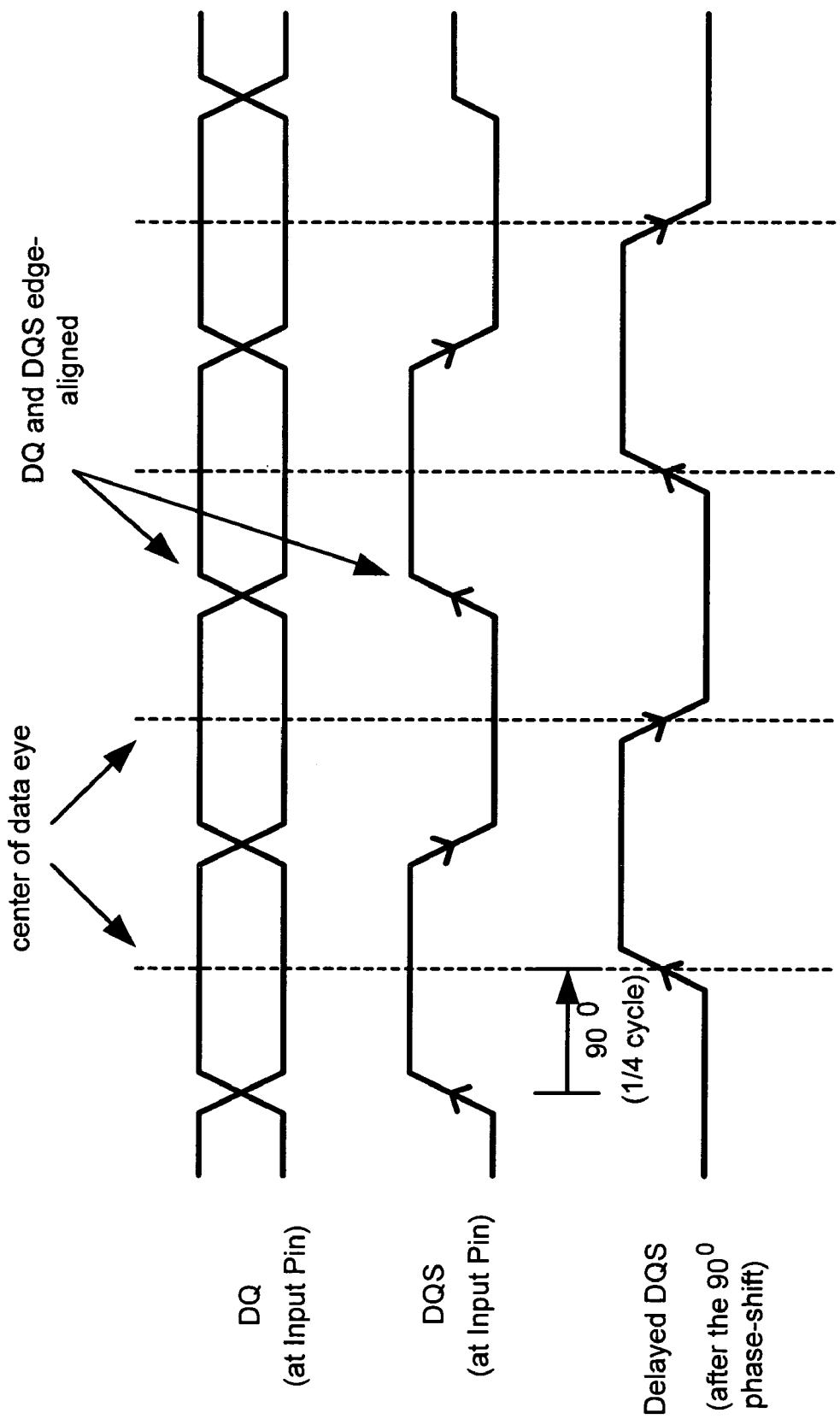
FIG. 1 shows DQ, DQS signals for a DDR application.
Figure 2:
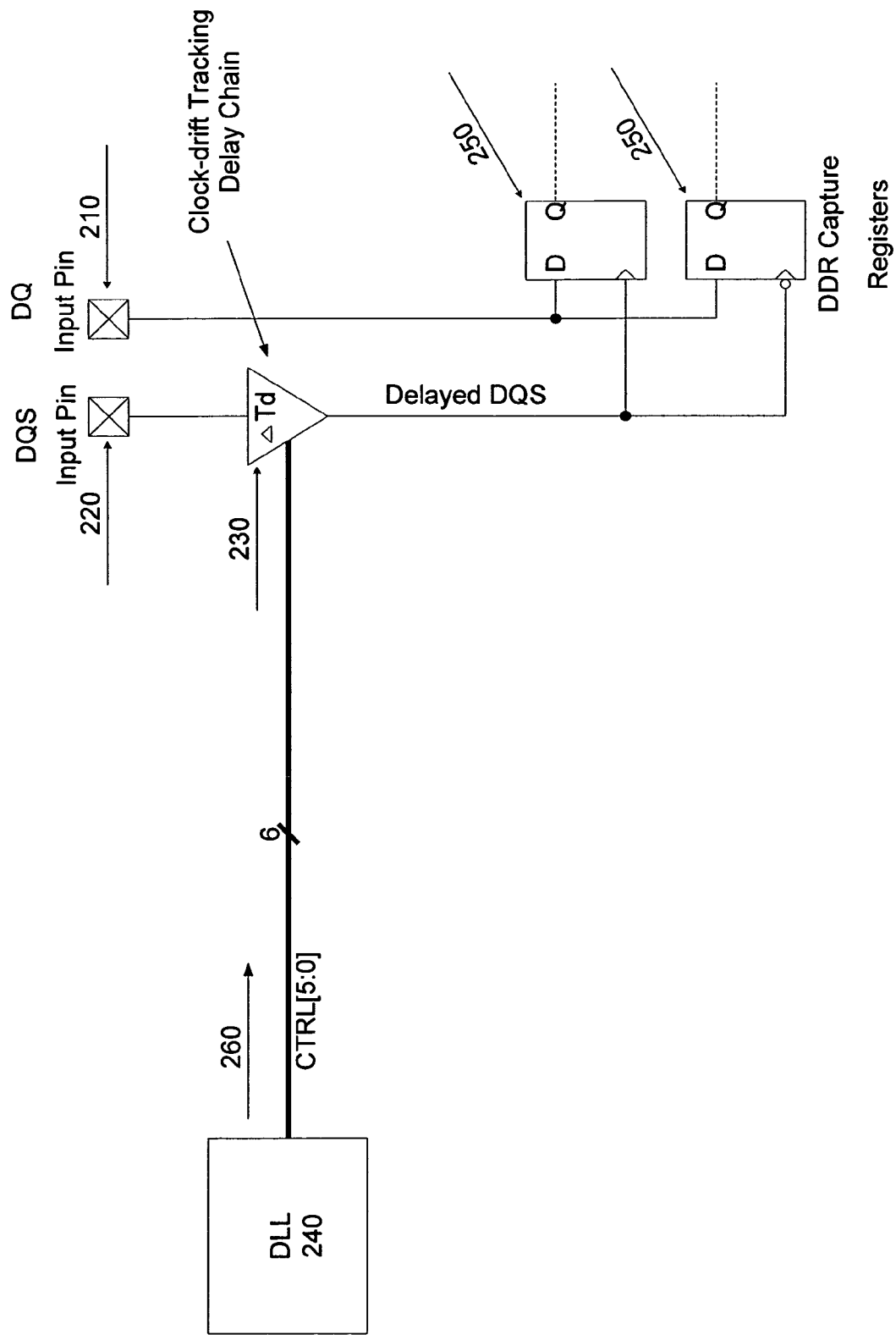
FIG. 2 is a schematic illustration of an exemplary circuit for controlling the DQS delay in a DDR application.
Figure 3:
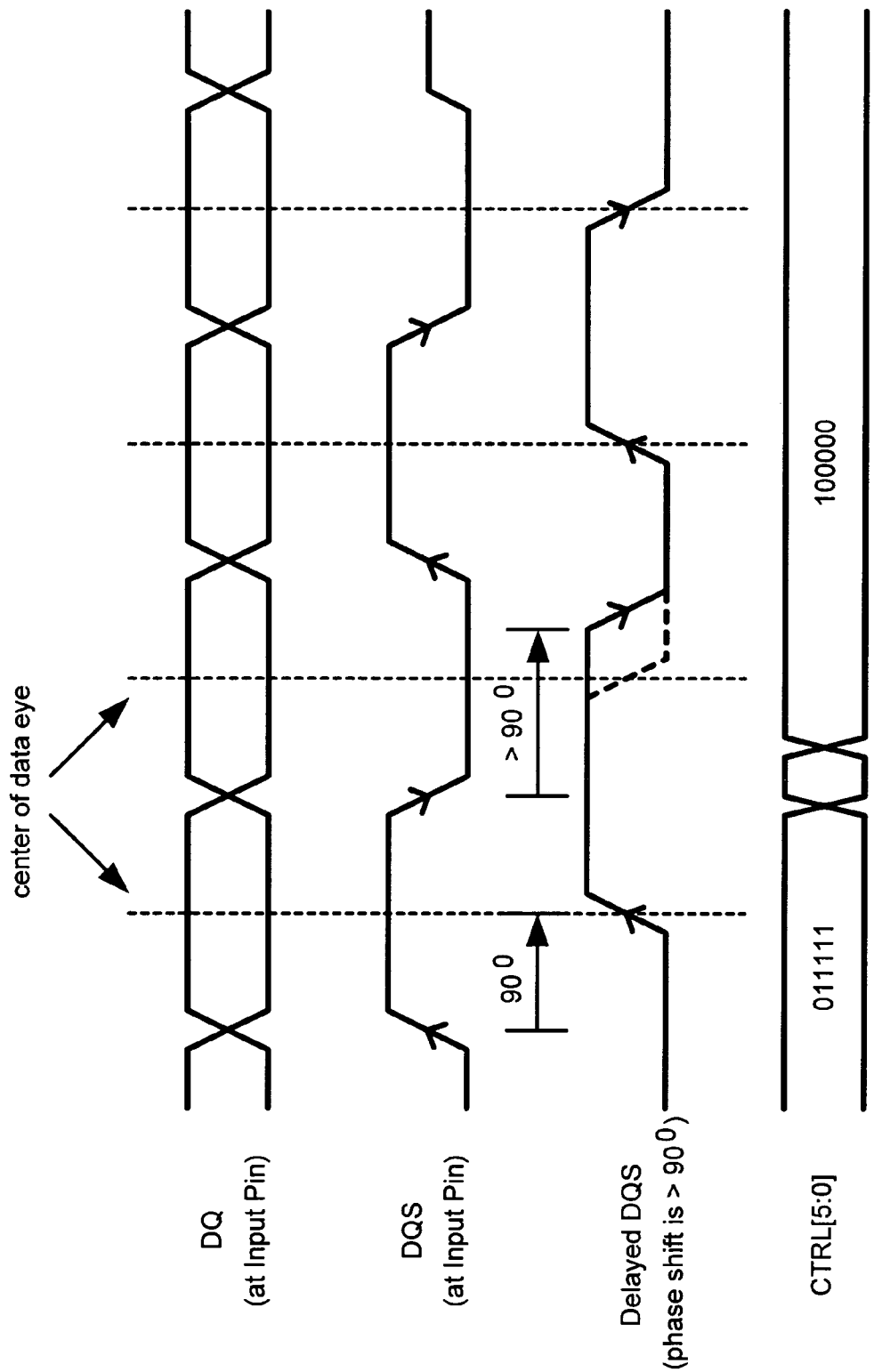
FIG. 3 illustrates how the DQS signal may be affected if a control signal is momentarily set to a higher value.
Figure 4:
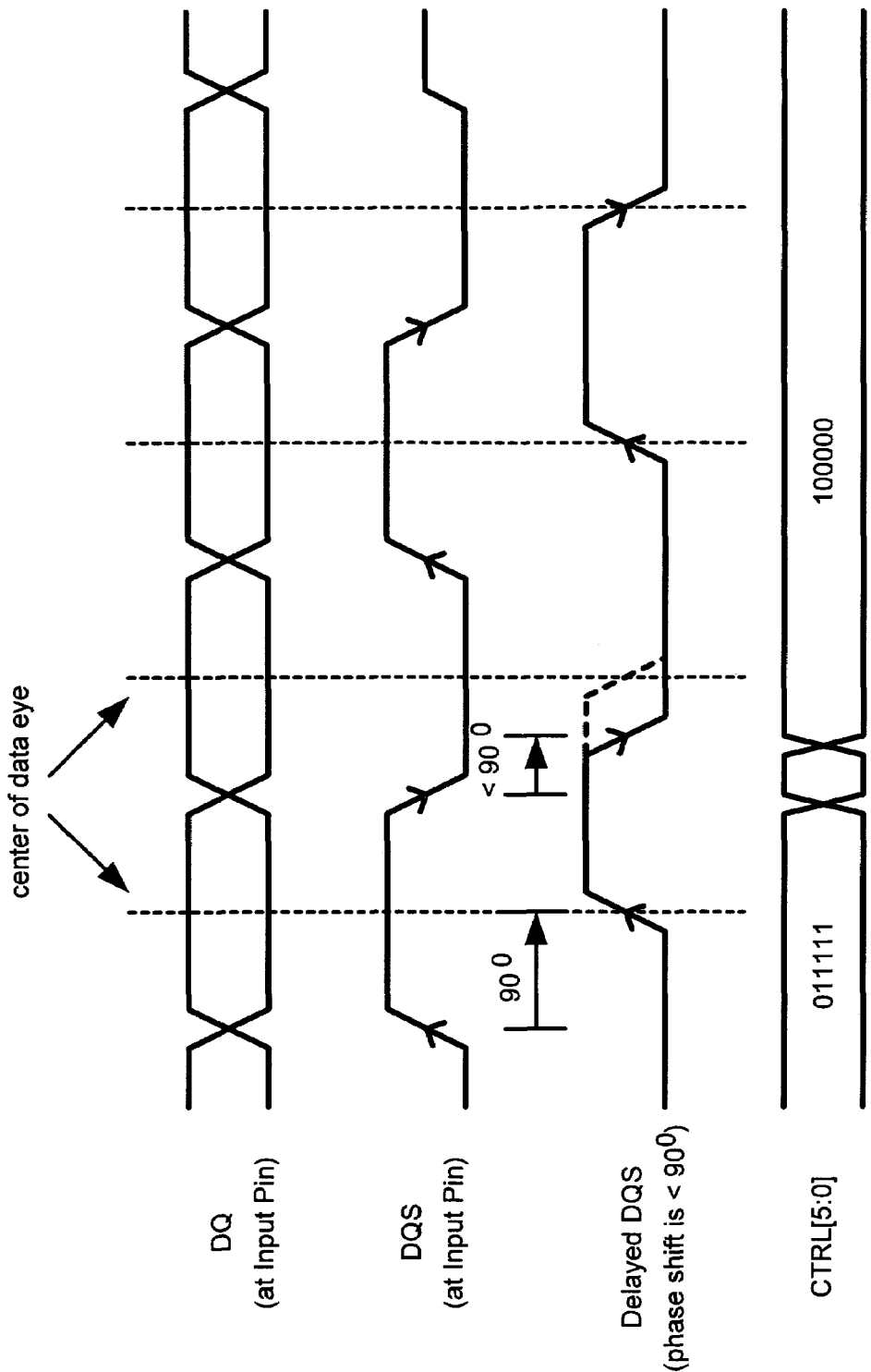
FIG. 4 illustrates how the DQS signal may be affected if a control signal is momentarily set to a lower value.
Figure 5:
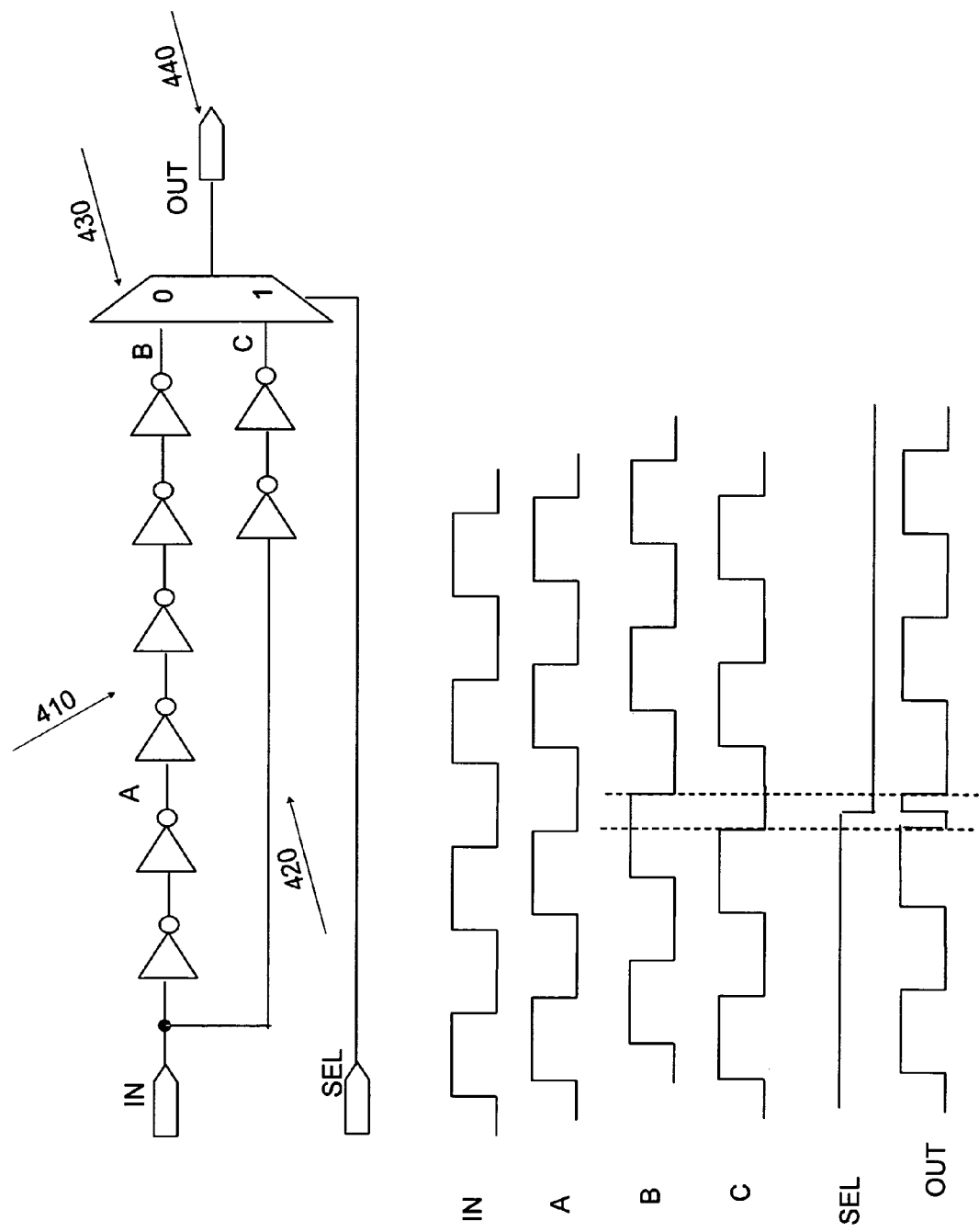
FIG. 5 shows an exemplary delay chain and associated signals illustrating how a glitch can occur at the output of the delay chain.
Figure 6:
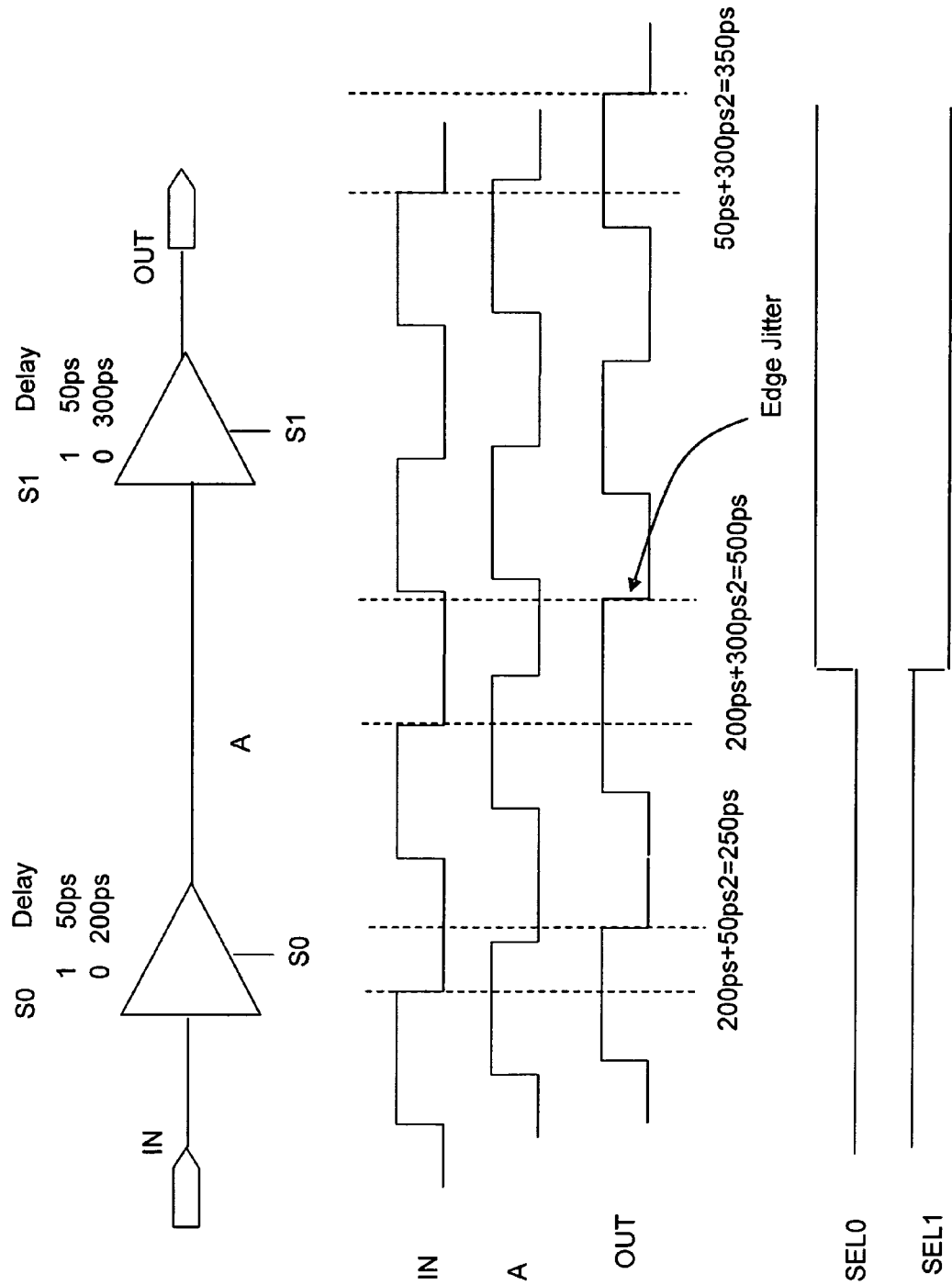
FIG. 6 shows an exemplary delay chain and associated signals illustrating how jitter can occur at the output of the delay chain.
Figure 7:
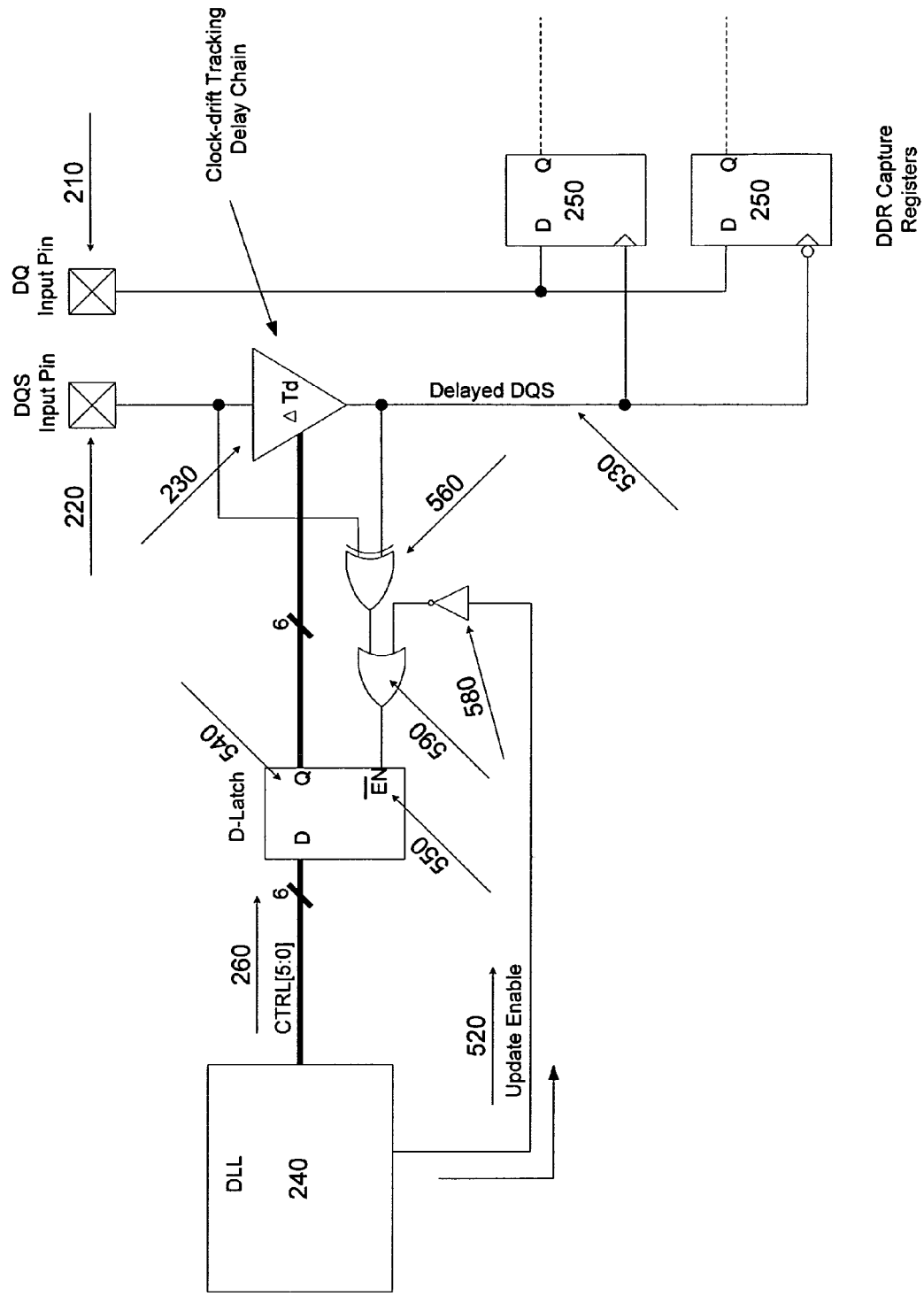
FIG. 7 is a schematic illustration of a circuit for controlling the DQS delay in accordance with an embodiment of the invention.
Figure 8:
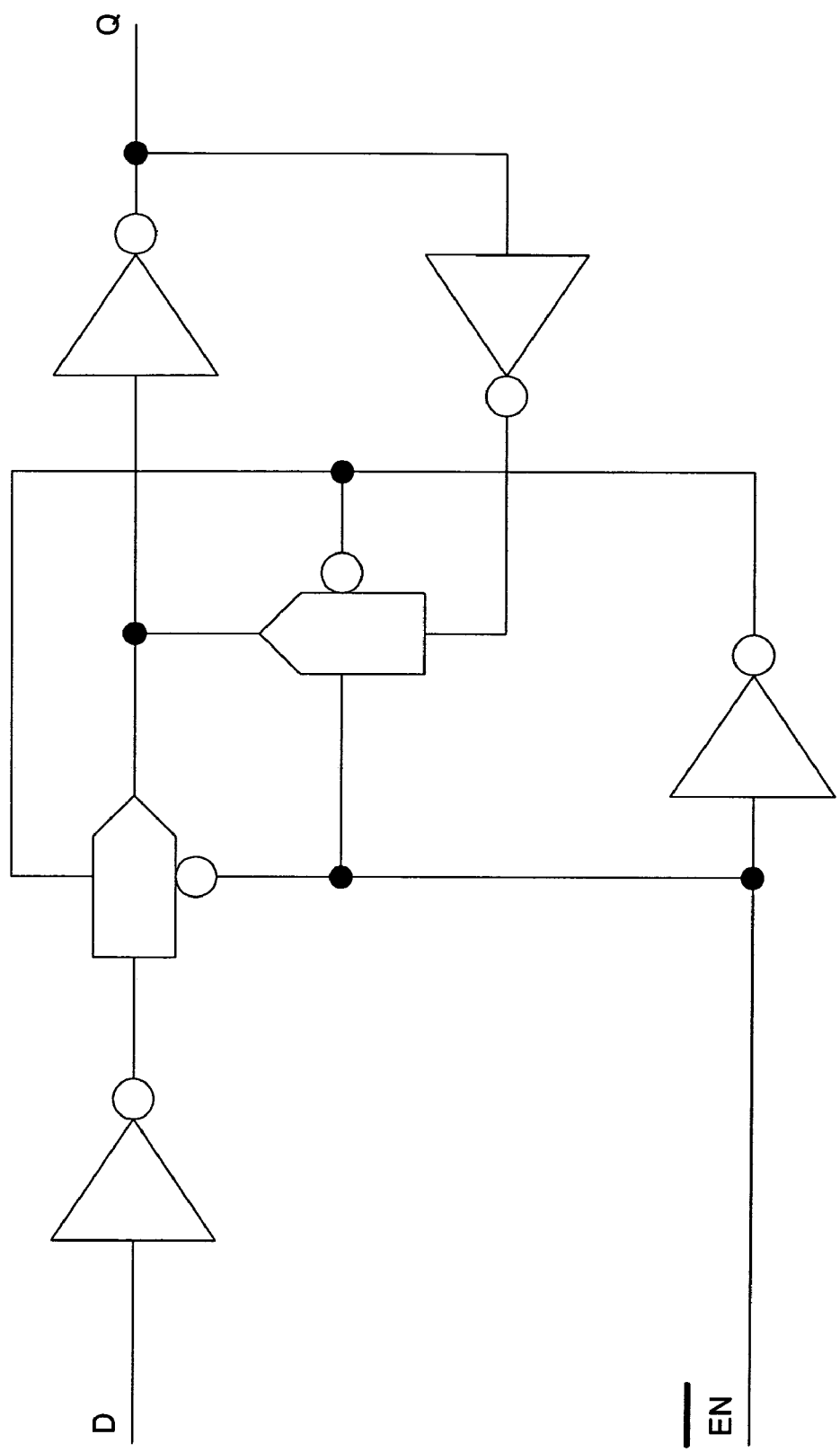
FIG. 8 is a schematic illustration of a D-Latch with an Active Low Enable.

FIG. 7 is a schematic illustration of a circuit for controlling the DQS delay in accordance with an embodiment of the invention. The circuit includes a DLL 240, DQ and DQS input pins 210 and 220 respectively, delay chain 230, and registers 250. The circuit also includes a D-latch 540, an XOR gate 560, an OR gate 590 and a NOT gate 580. A schematic of the D-Latch with an Active LOW Enable is shown in FIG. 8.

DLL 240 provides a control signal 260 to D-Latch 540. Preferably, control signal 260 is a 6-bit binary encoded control signal. Depending on the enable signal 550, the D-Latch either ignores the received control signal or passes it through to delay chain 230. The XOR gate has as inputs the DQS input signal 510 and the delayed DQS output signal 530. Delay chain 230 provides a delayed DQS output signal 530 based on the DQS input signal 510 and the control signal 260.

If the DQS output signal is not the same logical value as the DQS input, i.e. one is "HIGH" and the other is "LOW" (or vice cersa), then there is data propagating through the delay chain. In this case, the output of the XOR gate is "HIGH", thereby disabling the D-latch. Thus, the control signal 260 is not transmitted to the delay chain 230. If the DQS signal output is the same logical value as the DQS input, i.e. both are "HIGH" or both are "LOW", then no data is propagating through the delay chain. In this case, the output of the XOR gate is "LOW" and the D-latch is enabled. Signal 260 passes through the D-Latch 540 and is transmitted to the delay chain 230.

In addition to the XOR gate controlling the D-Latch, the Update Enable signal 520 can override the XOR output. The Update Enable signal passes through a NOT gate 580 and then serves as an input to OR gate 590. The output of the XOR gate is the second input to the OR gate. The Update Enable signal is used to prevent the control signal from changing at the delay chain 230 before all six control signals have arrived at the delay chain.

Figure 9:
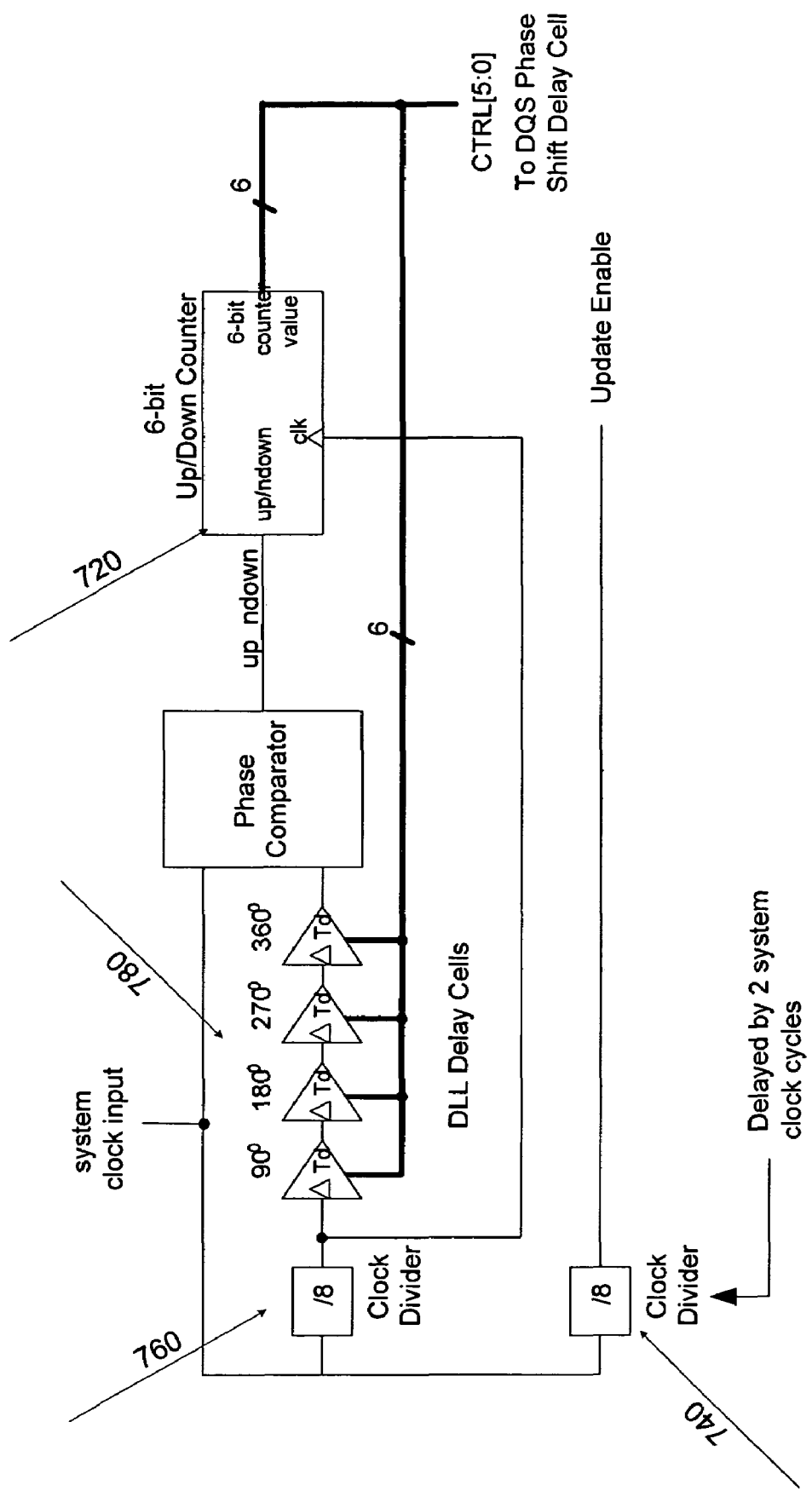
FIG. 9 is an exemplary schematic of a DLL in accordance with an embodiment of the invention.
Figure 10:
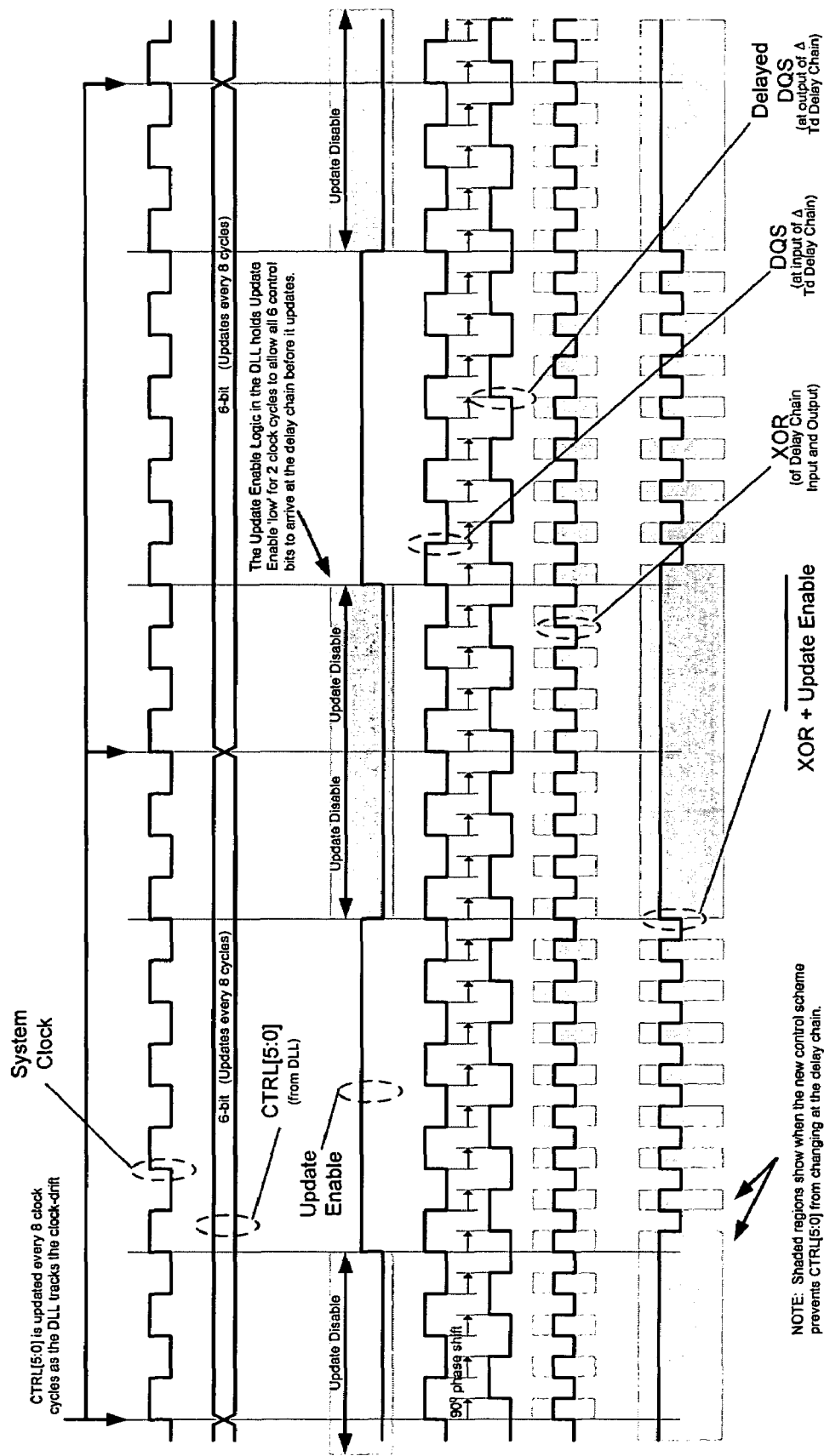
FIG. 10 shows a timing waveform for the circuit of FIG. 5.

Referring to FIG. 9, Control signal 260 are generated from a 6-bit Counter 720 that is clocked from a /8 Clock Divider 760. Thus, the control signals 260 are updated every eight clock cycles. The control signal may be provided by either the DLL 240 or by other circuitry that may be coupled to the D-Latch 540. Every time the DLL 240 updates the control signals 260, it also sets the Update Enable signal 520 to "LOW" for two clock cycles. No updates are allowed during these two clock cycles. This is accomplished by using a second /8 Clock Divider 740. Clock Divider 740 is delayed by two clock cycles with respect to the 6 bit Counter 720 clock. This holds the Update Enable signal "LOW" for two clock cycles. A "LOW" Update Enable signal forces the OR gate to a "HIGH", thereby disabling the D-Latch. The D-Latch does not pass through the control signal 260 and no updates are allowed. This allows the six control signals to arrive at the delay chain before the delay chain is updated. FIG. 10 shows the timing waveform of the circuit shown in FIG. 7.

Decoder Circuit

Figure 11:
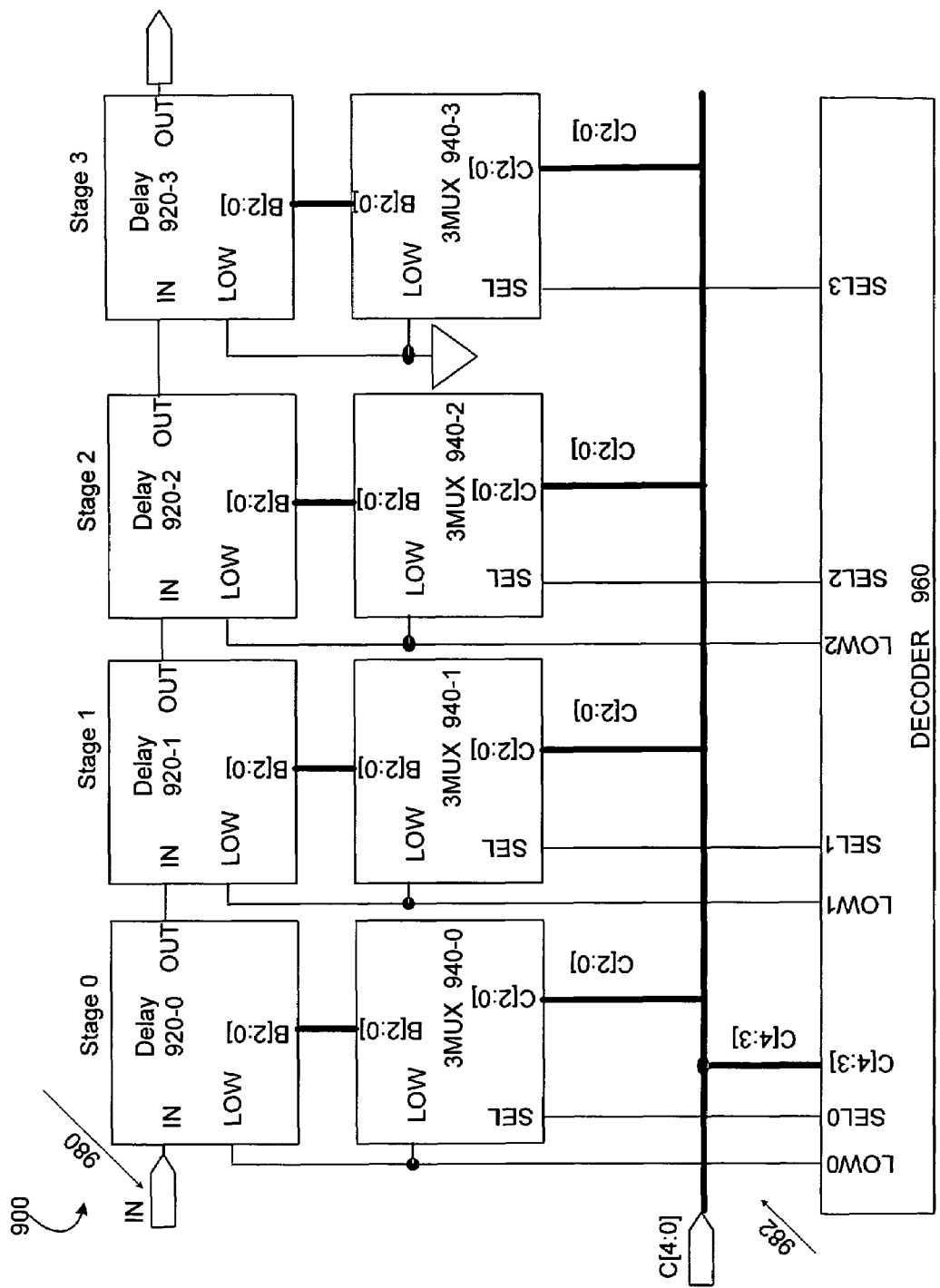
FIG. 11 is a block diagram of a delay cell in accordance with an embodiment of the invention.

FIG. 11 shows a detailed illustration of the DLL Delay Cells 780 of FIG. 7. While the following description is provided in the context of the DLL circuit of FIG. 7, those skilled in the art will appreciate that the delay cell of present invention can be used in other integrated circuit applications. For example, the delay chain 230 may be implemented in accordance with the present invention.

Delay cell 900 includes four delay chains 920, four multiplexers 940 and a decoder 960. Each multiplexer 940 provides a control signal to its associated delay cell 920. Decoder 960 provides a select signal to each multiplexer. Decoder 960 also provides a LOW signal to each multiplexer and delay cell. Delay cells 920, multiplexers 940, and decoder 960 are described in greater detail in FIGS. 12–14. While FIG. 11 shows a delay cell 780 as having four delay chains 920, those skilled in the art will appreciate that any number of delay chains may be used in accordance with the invention.

Decoder 960 receives a 5 bit delay cell control signal C[4:0] and uses the two most significant bits of signal C[4:3] to generate the SEL0, SEL1, SEL2 and SEL3 signals. Those skilled in the art will realize that other control signals may be used to control the delay chain in accordance with the invention. Decoder 960 also uses the two most significant bits to generate the LOW0, LOW1 and LOW2 signals. The other 3 bits of control signal C[4:0] are transmitted to each of the four multiplexers 940.

Multiplexers 940, have as inputs the three remaining bits of the 5 bit delay cell control signal C[4:0], the SEL and LOW signals generated by decoder 960. Multiplexers 940 output the 3 bit delay cell control signal C[2:0] as B[2:0]. At any given time, only one of the four multiplexers 940 will be active. SEL signal determines which of the four multiplexers will be active.

Delay cell 920-0 receives as inputs, the input signal IN 980 that is to be delayed, a LOW signal 982 and a control signal B[2:0] 984. The LOW signal is generated by decoder 960. Control signal 984 is the output signal of multiplexer 940. Preferably, control signal 984 is a 3 bit binary signal. The output of delay chain 920-0 serves as the input to delay chain 920-1, the output of delay chain 920-1 serves as the input to delay chain 920-2, etc.

Figure 12:
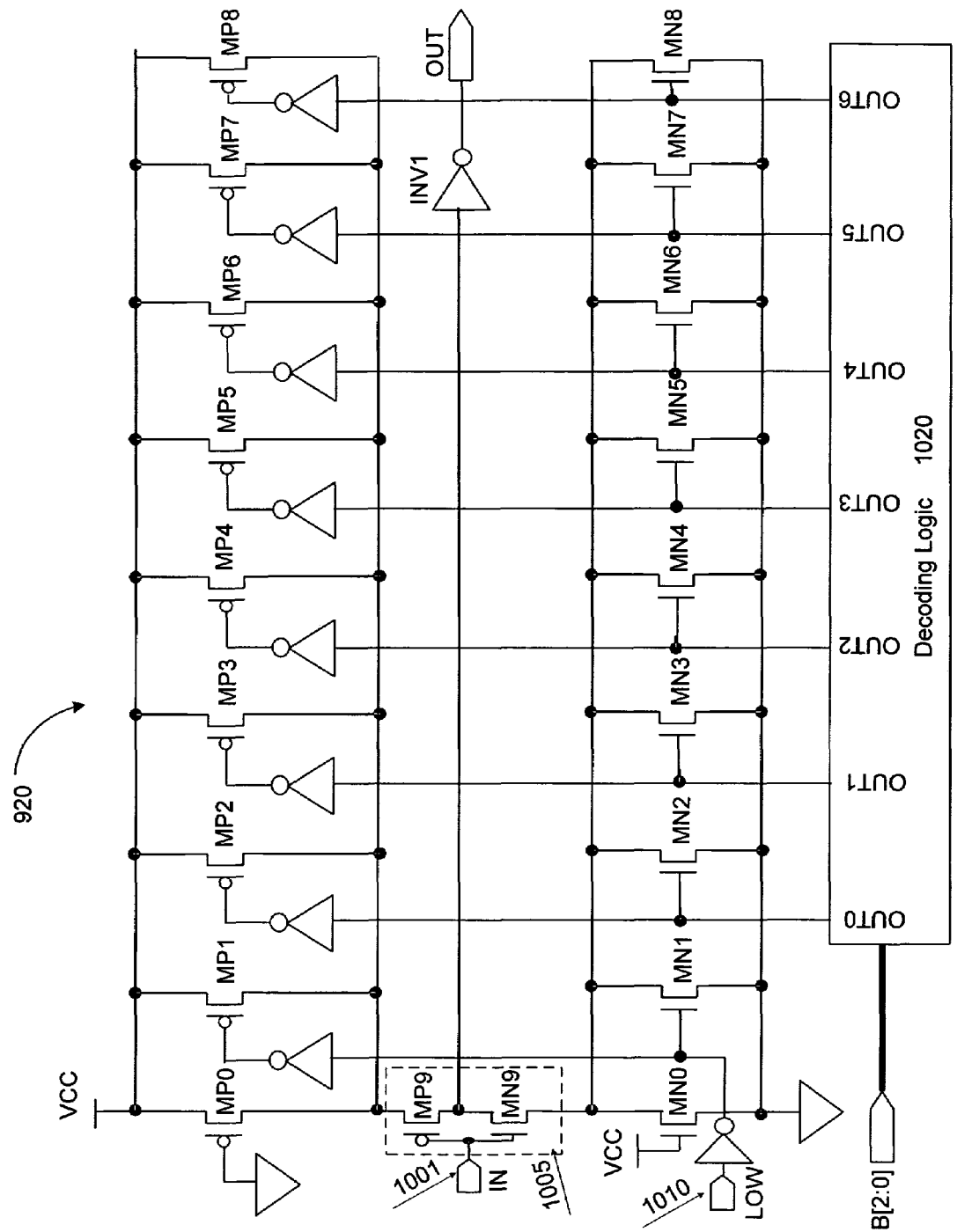
FIG. 12 is a schematic of one of the four delay chains in the delay cell of FIG. 11.

FIG. 12 is a schematic illustration of a delay chain 920 in accordance with an embodiment of the invention. An input signal 1001 passes to a first inverter 1005. The first inverter comprises a PMOS transistor MP9 and an NMOS transistor MN9. PMOS/NMOS transistors MP0 and MN0 are connected to MP9 and MN9, respectively. MP0 and MN0 are also connected to VCC and ground. MP0 and MN0 are always on to ensure that current is flowing through MP9 and MN9. Transistors MP1 through MP8 are connected in parallel to each other and to the source of MP9. Similarly, transistors MN1 through MN8 are connected in parallel to each other and to the source of MN9.

Preferably, transistors MP1 through MP8 and MN1 through MN8 are sized such that when turned on sequentially, they provide substantially identical delay to inverter 1005. For example, transistor pair MN1–MP1 provides a delay of X. When the MN2–MP2 transistor pair is turned on next, the delay at inverter 1005 will be about two times X. When the MN3–MP3 transistor pair is turned on the delay at inverter 1005 will be three times Z, etc. In one embodiment, transistors MP1 through MP8 and MN1 through MN8 are current limiting transistors. Although, this embodiment has eight transistor pairs, those skilled in the art will appreciate that any number of transistor pairs may be used. Additionally, the transistor pairs may provide an incremental delay that is not the same for each transistor pair. For Example, transistor pair MN1–MP1 may provide a delay X, transistor pair MN2–MP2 may provide a delay Y where Y has a different value from X. Thus the delay change need not be linear.

The delay time of inverter 1005 is controlled by the eight pairs of transistors MP1–MP8 and MN1–MN8. Transistor pair MP1–MN1 is controlled by the LOW signal 1010. Transistor pairs MP2–MN2 through MP8–MN8 are controlled by OUT signals 0–6 provided by decoding logic circuit 1020. Decoding logic 1020 receives a 3 bit signal B[2:0] from multiplexer 940 and generates OUT signals 0–6.

The largest delay is provided when LOW has a logical "HIGH" value and B[2:0] has a logical "LOW" value, in this case transistors MN1–8 and MP1–8 are all off. When LOW is "LOW" and B[2:0] are "LOW" then transistors MN1 and MP1 are on, thereby reducing the delay. Similarly, if LOW is "LOW" and B0 is "HIGH" and B1 and B2 are "LOW", then transistors MN1, MN2, MP1, and MP2 are on, thereby further reducing the delay, etc. When LOW is "LOW" and B[2:0] is "HIGH", then all transistors MN1–8 and MP1–8 are on, providing the smallest delay.

Since there are eight pairs of transistors, there are eight steps from the largest to the smallest delay for each delay chain. Therefore, the delay cell has a total of 32 steps between the largest and the smallest delay of the delay cell. Although the delay cell of FIG. 11 includes four substantially identical delay chains, those skilled in the art will appreciate that the delay chains need not be identical and further that the steps between delays need not be identical.

Figure 13:
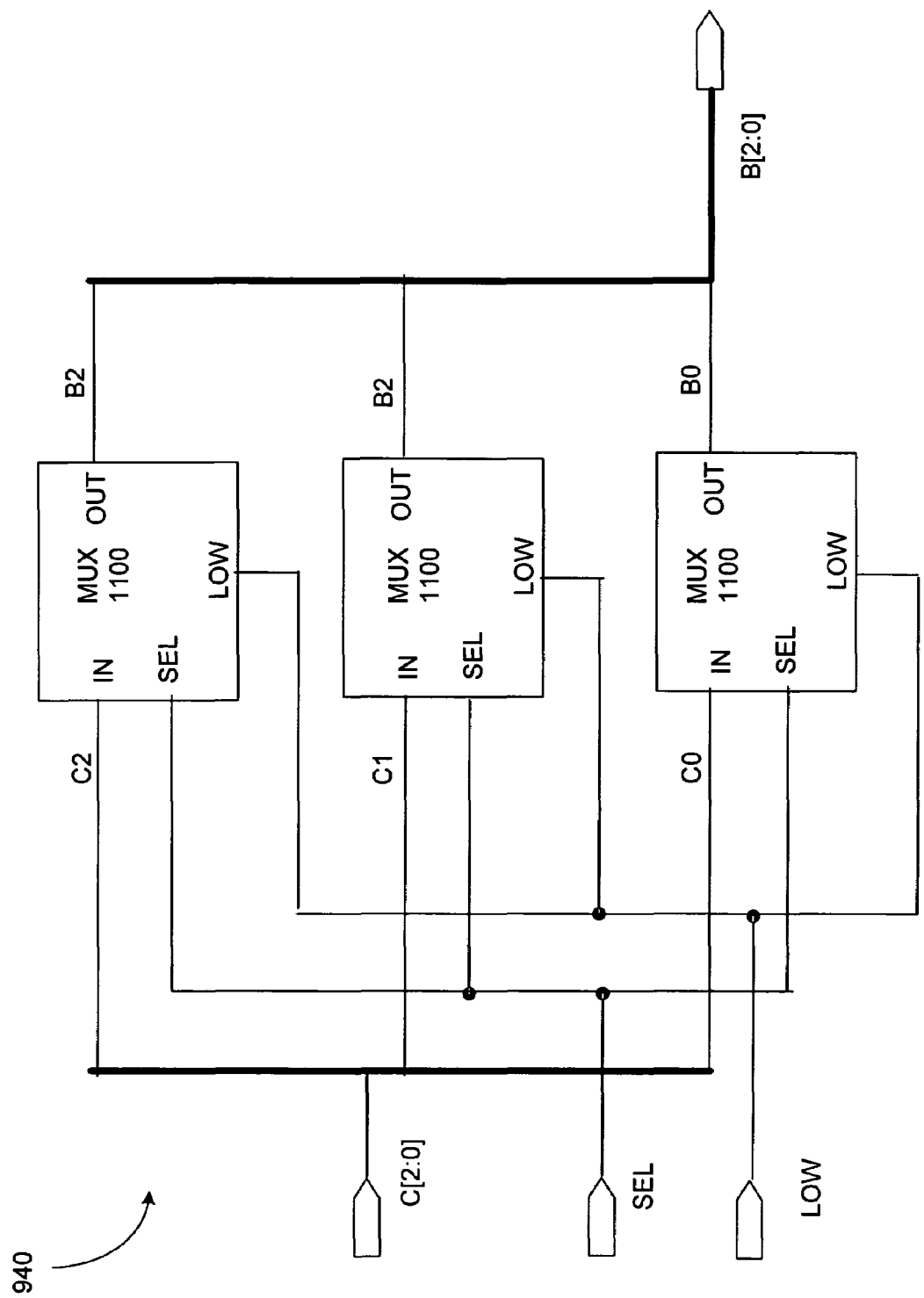
FIG. 13 is a schematic illustration of one of the four multiplexers in the delay cell of FIG. 11.

FIG. 13 is a schematic illustration of a 3MUX multiplexer 940 in accordance with the invention. Each 3MUX multiplexer 940 includes 3 multiplexers 1100. Each multiplexer 1100 controls one bit of the C[2:0] signal received by 3MUX multiplexer 940. The output of 3MUX multiplexer 940 B[2:0] is transmitted to delay chain 920.

Figure 14:
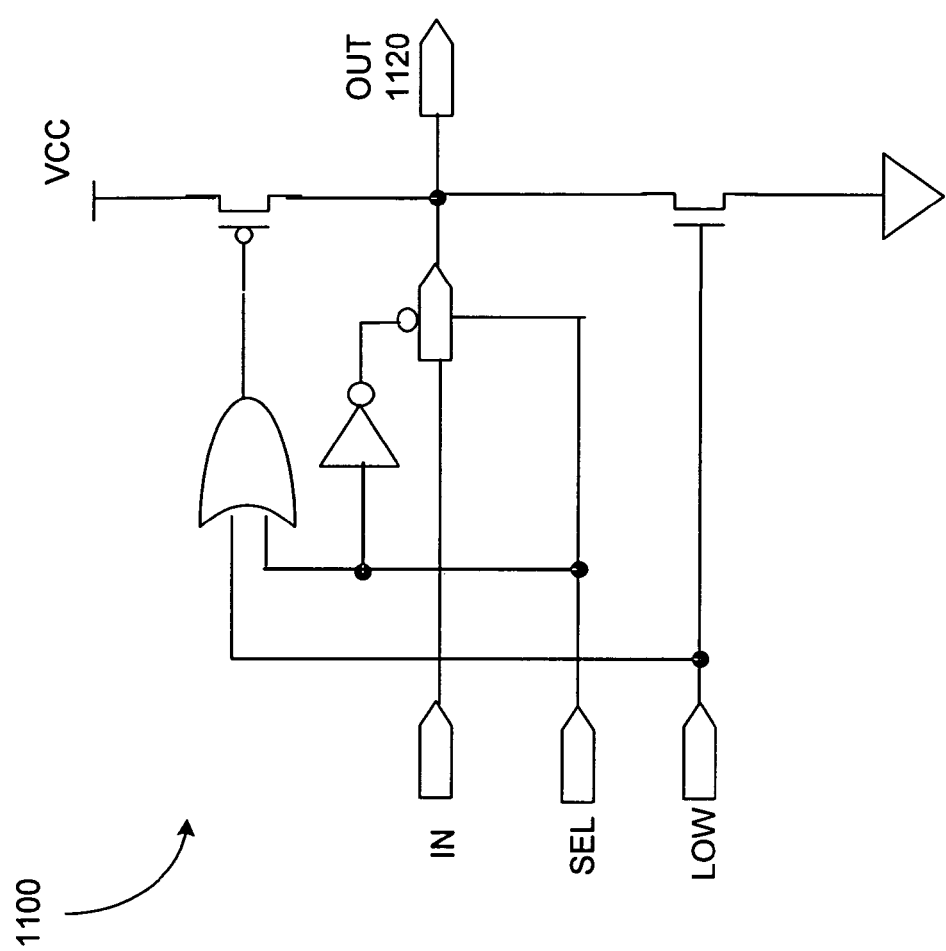
FIG. 14 is a schematic of one of the three multiplexers in the multiplexer of FIG. 13.

FIG. 14 provides a more detailed schematic of multiplexer 1100. Multiplexer 1100 has 3 inputs and one output 1120: a control signal input C, a selector input SEL and a LOW signal input. When both SEL and LOW are "LOW", then the output 1120 is "HIGH". Since the SEL and LOW signals are the same for all three multiplexers 1100, the outputs of 3MUX multiplexer 940 will also be "HIGH". In this case, all of the transistors in delay chain 920 will be on, providing the smallest delay. Similarly, when SEL is "LOW" and LOW is "HIGH" then the output 1120 is "LOW". The output of 3MUX multiplexer 940 will be "LOW", all transistors in delay chain 920 will be off, providing the largest delay.

When SEL is "HIGH" and LOW is "LOW", the multiplexer 1100 passes through the input value, i.e. C1 to B1. The delay is then determined by the logical values of B0, B1 and B2. Note that it is illegal for both SEL and LOW to be "HIGH". Also, at any given time, only one SEL can be "HIGH". Thus, only one of the four 3MUX multiplexers 940 is active at any one time. In other words, three of the four delay chains provide a fixed delay while the delay of one chain is adjusted. Additionally, the delay of the one delay chain is adjusted by sequentially turning on transistors or by sequentially turning off transistors. Turning on/off only one pair of transistors at a time avoids any jitter associated with switching transistors in opposite directions simultaneously.

Figure 15:
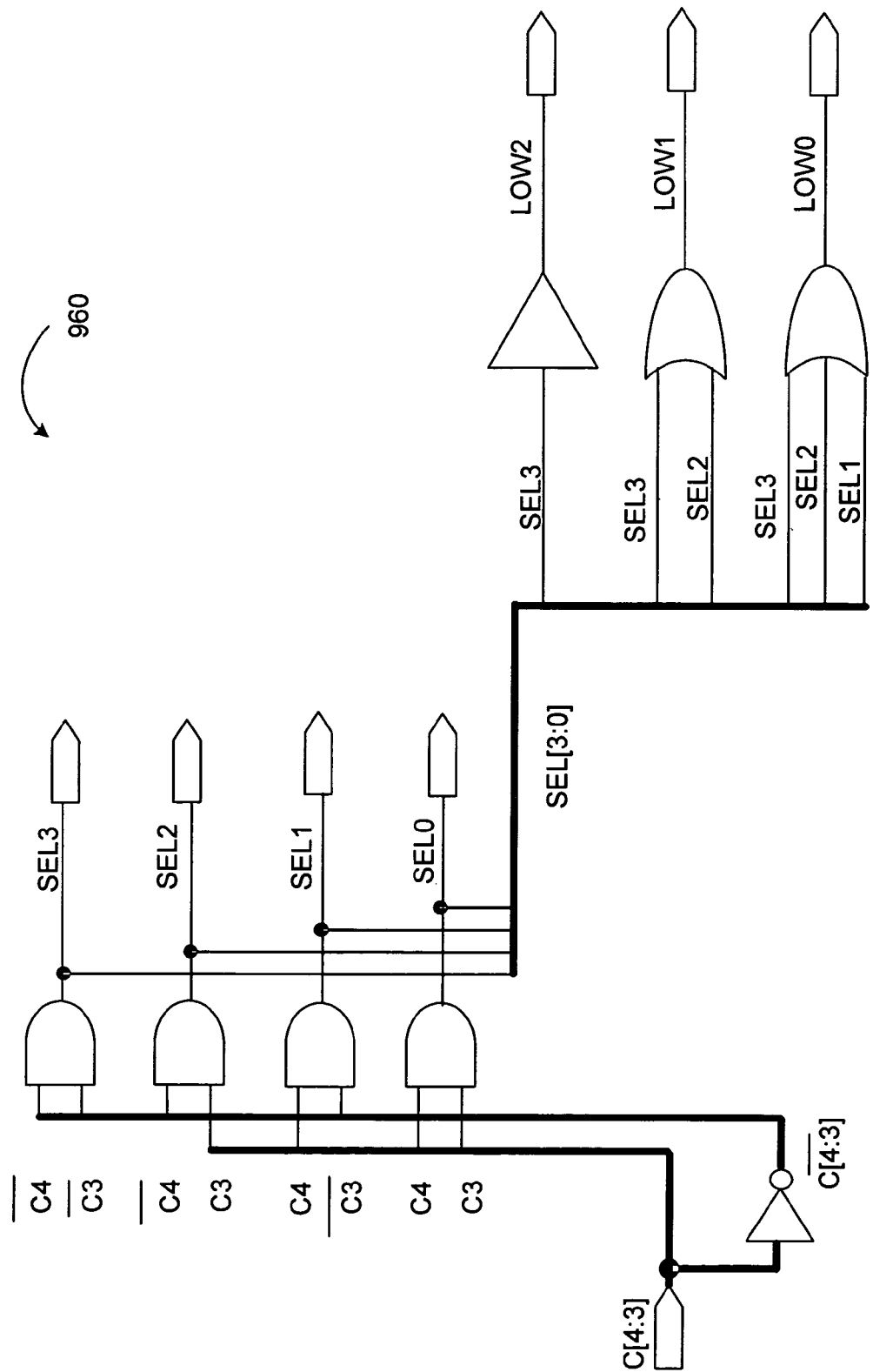
FIG. 15 is a schematic of the decoder circuit of the delay cell of FIG. 11.

FIG. 15 is a schematic illustration of a decoder 960 in accordance with the invention. Decoder 960 decodes the 2 most significant bits of a 5 bit control signal C[4:0] to produce SEL signals SEL0, SEL1, SEL2 and SEL3. Decoder 960 also generates the LOW signals LOW0, LOW1 and LOW2 from control signal C[4:3]. It will be apparent to those skilled in the art that when the Stage 2 3MUX is actively changing the delay, both the Stage 0 and Stage 1 delay chain transistors are all off, providing the largest delay for those two delay chains. And the Stage 3 transistors are all on, providing the smallest delay for that delay chain.

In order to reduce the time needed to reach the desired delay when the device is initially turned on, the SEL signal for 3MUXes at Stage 0, 1 and 3 are set to "LOW", the LOW for Stage 0 and Stage 1 3MUXes is set to "HIGH" and the LOW for Stage 2 and Stage 3 is set to "LOW". Thus, delay chains at Stage 0 and Stage 1 are set to provide the largest delay while Stage 2 and Stage 3 delay chains are set to provide the smallest delay.

If greater delay is desired then the transistors in delay chains at Stage 2 are turned off sequentially. If even greater delay is needed then the transistor in delay chains at Stage 3 are turned off next, again sequentially. Similarly, if less delay is desired then the transistors in delay chains at Stage 1 are turned on. For even less delay, the transistors at Stage 0 are turned on next, again sequentially.

By starting at the midpoint, the time required to achieve the desired delay is reduced while the jitter and glitch on output is reduced by sequentially turning the transistors on or off. FIG. 15 is a truth table for the delay cell of FIG. 11.

The foregoing description of specific embodiments of the invention has been presented for the purposes of illustration and description. It is not intended to be exhaustive or to limit the invention to the precise form described. Many modifications and variations are possible in light of the teachings above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
    a delay chain having a DQS input, a DQS output and a control signal input,
    a register connected to the delay chain, the register having an input for receiving the control signal and an output for transmitting the control signal to the delay chain, wherein
    if a DQS signal is passing through the delay chain, the register will ignore any changes to the input,
    if a DQS signal is not passing through the delay chain, the register will pass through any changes to the input.

2. The circuit of claim 1 further including an XOR gate connected to the delay chain and to the register, the XOR gate having as inputs the DQS input and the DQS output of the delay chain, the XOR gate providing an enable signal to the register.

3. The circuit of claim 2 further including an OR gate, the OR gate having as inputs the output of the XOR gate and an update enable signal, the output of the OR gating providing an enable signal to the register.

4. The circuit of claim 3 wherein the update enable signal to the OR gate is provided by a delay lock loop (DLL).

5. The circuit of claim 4 wherein the DLL provides the input to the register.

6. The circuit of claim 5 wherein the control signal is provided by a DLL, wherein the DLL continuously tracks a system clock frequency, wherein the DLL changes the control signal in response to the tracking.

7. The circuit of claim 6 wherein the control signal is 6-bit binary encoded control signal.

8. The circuit of claim 5 wherein the DLL includes a counter, a first clock divider and a second clock divider, wherein the first clock divider provides a counter clock signal to the counter, wherein the second clock divider provides an update enable clock signal for the update enable signal, wherein the update enable clock signal is delayed with respect to the counter clock signal.

9. The circuit of claim 8 wherein the first and second clock dividers are divide by eight clock dividers.

10. The circuit of claim 8 wherein the update enable clock signal is delayed by two clock cycles with respect to the counter clock signal.

11. A programmable logic device including the circuit of claim 1.

12. A data processing system comprising:
    processing circuitry;
    a memory coupled to the processing circuitry;
    a programmable logic device coupled to the processing circuitry and the memory, the programmable logic device comprising the circuit of claim 1.

13. A printed circuit board on which is mounted a programmable logic device comprising the circuit of claim 1.

14. The printed circuit board of claim 13 further comprising a processing circuitry coupled to the programmable logic device.

15. The printed circuit of claim 14 further comprising a memory coupled to the processing circuitry and to the programmable logic device.

16. A method of controlling a delay chain, the delay chain having an input signal, an output signal and a control signal, the method comprising:
    comparing an input and an output signal of the delay chain;
    determining if a signal is passing through the delay chain; and
    if a signal is passing through the delay chain, then not updating the control signal at the delay chain,
    if a signal is not passing through the delay chain, then updating the control signal at the delay chain.

17. The method of claim 16 wherein the input signal is a DQS signal and the output signal is a delayed DQS signal.

18. The method of claim 17 wherein the delayed DQS signal is delay by 90 degrees with respect to the DQS signal.

19. The method of claim 18 wherein the determining comprises comparing the logical values of the input and the output signal wherein
    if the logical values of the input signal and the output signal are the same then no signal is passing through the delay chain;
    if the logical values of the input signal and the output signal are not the same then a signal is passing through the delay chain.

20. The method of claim 16 wherein the control signal is a binary encoded control signal, preferably a 6 bit binary encoded control signal.

* * * * *